United States Patent [19]

Ketchen

[11] Patent Number: 4,528,530
[45] Date of Patent: Jul. 9, 1985

[54] LOW TEMPERATURE ELECTRONIC PACKAGE HAVING A SUPERCONDUCTIVE INTERPOSER FOR INTERCONNECTING STRIP TYPE CIRCUITS

[75] Inventor: Mark B. Ketchen, Ossining, N.Y.

[73] Assignee: International Business Machines Corporation, Armonk, N.Y.

[21] Appl. No.: 422,911

[22] Filed: Sep. 24, 1982

[51] Int. Cl.³ .............................................. H01P 5/00
[52] U.S. Cl. .................................. 333/246; 333/99 S; 333/260; 339/17 LM; 339/17 M; 361/413
[58] Field of Search ................. 333/238, 246, 260, 99; 339/17 LM, 17 M, 59 M; 361/413

[56] References Cited

U.S. PATENT DOCUMENTS

| | | | |
|---|---|---|---|
| 2,832,942 | 4/1958 | French | 339/17 LM |
| 3,164,750 | 1/1965 | Miller | 317/101 |
| 3,425,021 | 1/1969 | Fow et al. | 339/17 |
| 3,529,213 | 9/1970 | Farrand et al. | 317/101 |
| 3,769,614 | 10/1973 | Bernstein | 333/238 |
| 3,795,884 | 3/1974 | Kotaka | 339/17 |
| 3,858,958 | 1/1975 | Davies | 339/17 LM |
| 3,924,915 | 12/1975 | Conrad | 339/17 F |
| 3,949,274 | 4/1976 | Anacker | 317/101 |
| 3,951,493 | 4/1976 | Kozel et al. | 339/17 M |
| 3,985,413 | 10/1976 | Evans | 339/17 LM |
| 4,012,117 | 3/1977 | Lazzery | 350/160 |

Primary Examiner—Eugene R. LaRoche
Assistant Examiner—Benny T. Lee
Attorney, Agent, or Firm—Carl C. Kling

[57] ABSTRACT

The low temperature electronic package is a right angle connection utilizing an interposer rod between horizontal and vertical substrates. The interposer rod of insulating crystalline substrate material, has a superconducting metal ground plane on its surface, which ground plane is covered by an insulating film. Over the insulating film, the interposer has a number of arcuate conductors to which respective conductors of both the horizontal and vertical substrates are connected at controlled collapse pads for good electrical and mechanical connection. All circuits are effectively transmission lines because the underlying ground plane is continuous.

The interposer rod provides a robust, low inductance connector mechanism with a strain minimizing configuration, which permits both horizontal and vertical substrates to interconnect with great connection versatility. It provides for convenient removal and has great resistance to failure related to repeated temperature cycling. The interposer provides space for an array of connectors which permits the right angle connections to be closely spaced, at lithographic tolerances.

Connections between circuits on the vertical substrate and circuits on the horizontal substrate are made by connecting first to a circuit on the interposer and then to the circuit on the other substrate. The equivalent circuit model is transmission line, small inductance at the first controlled collapse connection, transmission line on the interposer, small inductance at the second controlled collapse connection, transmission line.

9 Claims, 6 Drawing Figures

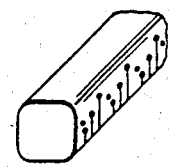
FIG. 3
FIG. 6
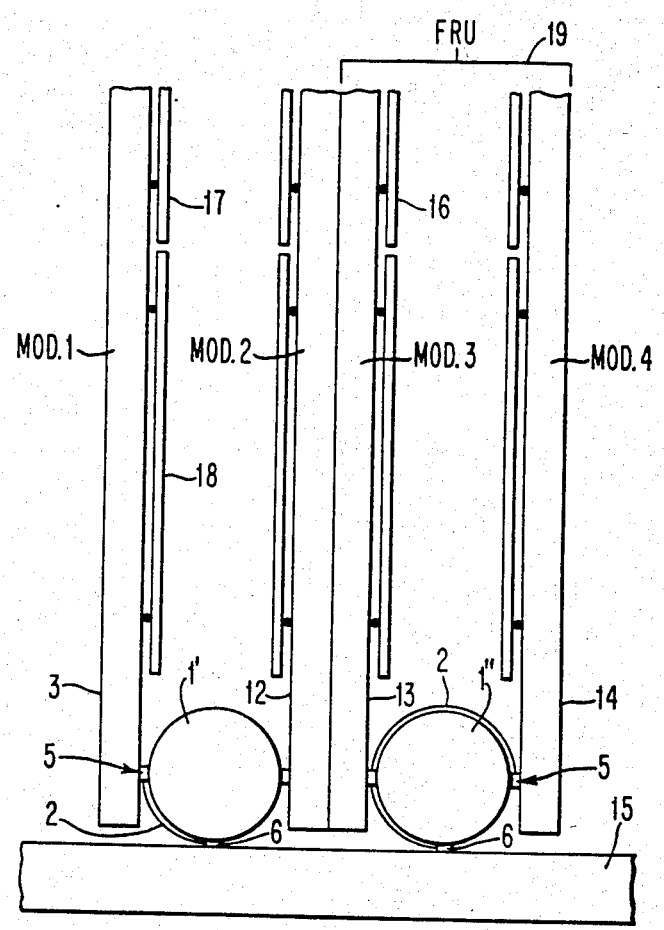
FIG. 4
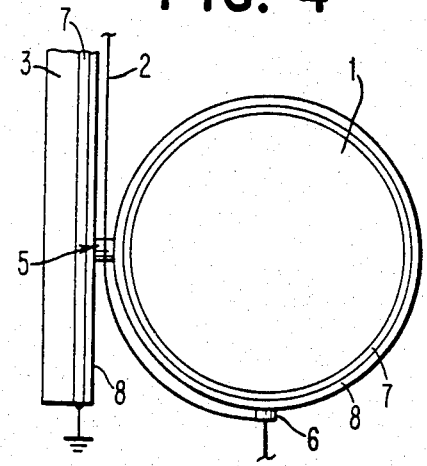
FIG. 5
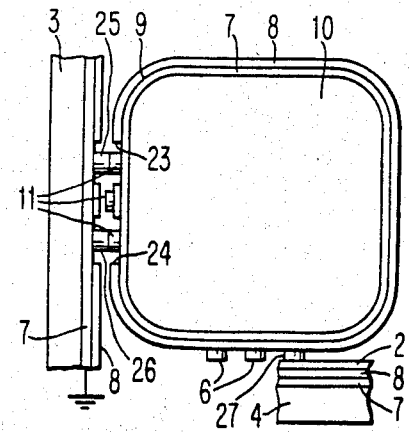

LOW TEMPERATURE ELECTRONIC PACKAGE HAVING A SUPERCONDUCTIVE INTERPOSER FOR INTERCONNECTING STRIP TYPE CIRCUITS

BACKGROUND OF THE INVENTION

1. Field of the Invention

The invention relates to electronic packaging, and particularly to a low temperature right angle chip connection technique.

2. Description of the Prior Art

Low temperature packaging techniques generally involve the use of materials having similar coefficients of expansion, with contacts which survive temperature cycling and still provide electrical contact at low temperatures.

The very low temperatures (4.2° K.) used with Josephson junction circuits are subject to special problems and advantages. The advantages are related to the superconducting nature of the circuitry, and, even where the circuitry is not superconducting, the excellent heat transfer ability of the liquid helium which is the source of the low temperatures. Special problems are related to the expansions and contractions of repeated cycling between room temperature and liquid helium temperature, particularly where joints having mating materials of different thermal expansion coefficients are present.

Furthermore, in order to take advantage of the high speeds and other virtues of Josephson junction technology, it is necessary to make the wire lengths short so as to eliminate the time loss of signal propagation even at its near-speed-of-light velocities through the conductors. Short conductor lengths tend to require three dimensional packaging. Such packaging requires right-angle connections in addition to those connections normally required by a two-dimensional package. Right angle connections are made in a linear configuration, at the intersection of two planes, between conductors located in a horizontal plane and conductors located in a vertical plane. Right angle connectors provide connection for horizontal conductors to vertical conductors.

High circuit densities lead to a requirement for a high density of right angle connections in such a package. These connectors typically require solder or microplug structures for mechanical and electrical bonding of mating conductors. The processes required by such structures have tolerances far exceeding lithographic tolerances.

The linear density of connectors is not lithographically determined; the connector pads are bigger than the conductor lines which they connect.

Right angle connectors closely spaced in a linear array can present a relatively high inductance which results in unacceptable crosstalk unless signal shaping or other performance reducing measuring are taken.

The striplines and the right angle connection may be molded as two transmission lines of a particular characteristic impedance, separated by a connector modeled as a relatively large inductive discontinuity between them.

SUMMARY OF THE INVENTION

The invention is a right angle connection utilizing an interposer rod between horizontal and vertical substrates. The interposer rod is of insulating material, of the same material as the substrates the interposer connects, or of a material having the same coefficient of thermal expansion as the substrates. The interposer rod has a superconducting metal ground plane on its surface, which ground plane is in turn covered by an insulating film. Over the insulating film, the interposer has a number of arcuate microstripline conductors to which respective conductors of both the horizontal and vertical substrates are connected at surface tension controlled collapse, lead alloy or mercury "solder" connections. This provides good electrical and mechanical connection.

The interposer rod provides a robust, low inductance connector mechanism with a strain minimizing configuration, which low inductance connector mechanism permits both horizontal and vertical substrates to interconnect with great connection versatility, with the opportunity for convenient removal, and with great resistance to failure caused by differential thermal expansion in repeated temperature cycling.

The electrical characteristic impedance of the arcuate stripline conductors (over arcuate ground plane) is the same as that of the conductors of the horizontal and vertical substrates, which are over ground planes. The only inductive discontinuity is that presented by the controlled collapse connectors, which is very small provided that approximately 15% of the total number of the controlled collapse connectors are used to interconnect the ground planes. This permits acceptably low crosstalk even for signals with very fast rise times such as the signals used in Josephson technology. The ohmic resistance of the connector is very low compared to the characteristic impedance of the connected transmission lines.

The striplines and the right angle connection of this invention may be modeled as two transmission lines of a particular characteristic impedance, connected by a first small inductive discontinuity, at the first controlled collapse connector, a short transmission line of the same characteristic impedance as the other two transmission lines, and a second small inductive discontinuity at the second controlled collapse connector.

BRIEF DESCRIPTION OF THE DRAWINGS

FIG. 3 is a side elevation illustrating how multiple interposers, with a horizontal substrate and multiple vertical substrates, provide a compact package.

FIG. 4 shows a variation having only a vertical substrate, with an axially extending micropin connection in lieu of a horizontal substrate.

FIG. 5 shows a variation having an angle-free rounded corner square interposer cross section.

FIG. 6 is a side elevation illustrating a two-dimensional array of contact pads, which eliminates constraints based on contact spacing in a straight line.

DESCRIPTION OF THE PREFERRED EMBODIMENT

Figure 1:
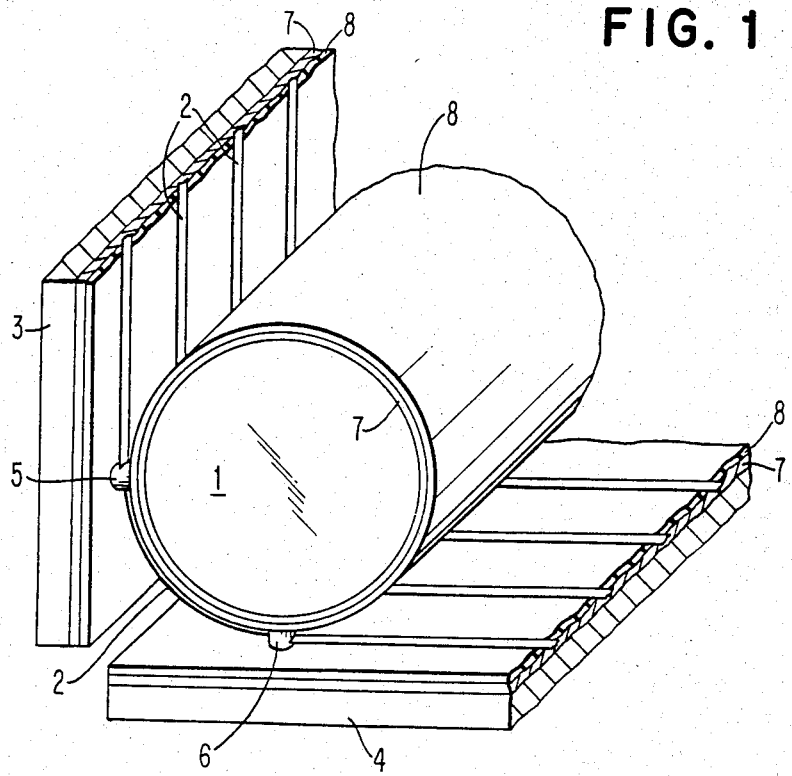
FIG. 1 is an isometric view of the invention, showing a portion of an angle-free cyclindrical section interposer interconnecting portions of horizontal and vertical substrates.
Figure 2:
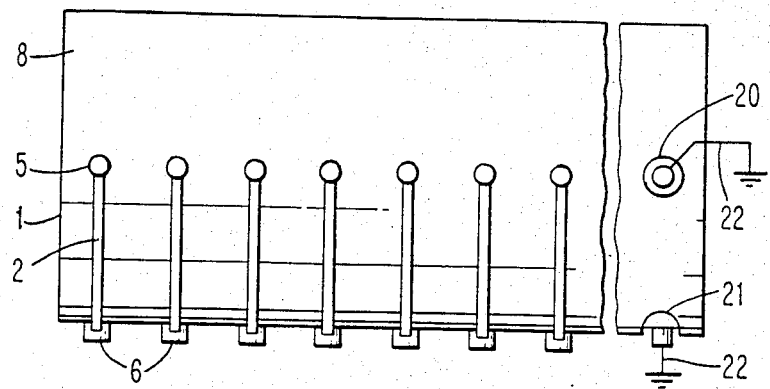
FIG. 2 is viewed through the vertical substrate portion, showing the interposer and conductors without showing the horizontal and vertical substrates.

FIGS. 1 and 2 illustrate the preferred embodiment. Silicon rod 1 serves as interposer substrate for conductor 2 and other conductors similarly arrayed on its angle-free surface of cylindrical cross-section. Conductors 2 connect vertical substrate 3 to horizontal substrate 4 at pads 5 and 6. The interposer is coated with ground plane film 7, over which lies an insulating film layer 8.

Ground plane metallization 7 and insulating film layer 8 are shown in FIG. 1 as layers having significant thickness—when in fact they are very thin films. In operation, interposer 1 and vertical substrate 3 have complementary circuit connections to surface tension controlled collapse chip connections 5 which can make connection through well known solder reflow techniques or related techniques using mercury as a low temperature solder. Other conductors are similarly connected, or may be connected by wire or micropin to respective contact pads such as pad 6. For an explanation of controlled collapse chip connections, see U.S. Pat. No. 3,429,040, W. Miller, Method of Joining a Component to A Substrate, Feb. 25, 1969.

Horizontal substrate 4 is similarly arrayed with a complementary circuit connection pattern having chip connections. When the chip connections have been completed, the three sections of each conductor 2 are connected; the result forms a three-dimensional package with low inductance, high mechanical strength connections via low inductance microstrip-over-groundplane transmission lines.

The reason for choosing three-dimensional packaging is primarily to provide shorter conductive paths for higher speed. Dense three-dimensional packaging, which helps minimize the effects of conductor length and the related delays, may lead to inductive and crosstalk problems. These problems are especially prevalent in high performance packaging where speed may be determined by the package rather than by the actual devices. This factor is especially important in the Josephson technology where delay along transmission lines is a limiting factor. Any type of electrical discontinuity, such as that resulting from a right angle connection, has a self-inductance which can slow down the signal and introduce ringing. The connector also has a mutual inductance with adjacent connectors which can transmit unwanted crosstalk signals into other circuits. The right angle connector mechanisms of this invention resolves this problem by using a ground plane, not only beneath the conductors generally, but also beneath the wiring on the right angle connector. Thus, even though a three-dimensional package is shown, the three-dimensional package has essentially the electrical characteristics of a two-dimensional package.

Thin film superconductive layer 7 is continuous about the periphery of the right angle connection. It serves as a ground plane. Conductors overlaid on this arcuate ground plane have the general characteristics of grounded stripline connectors, rather closely approaching the characteristics of an ideal transmission line. Mechanically, conductors may follow this arcuate path with very little danger of damage during handling and with minimized risk of mismatched expansion during even the large swing temperature cycling of superconductive circuits. Well known two-dimensional array techniques of mechanical contacts may be used on both the vertical and horizontal substrates. It is particularly easy to make complex connections, of the two-dimensional arrays of electromechanical or mechanical contacts rather than only a single row of contacts, which is more common in three-dimensional electronic packaging. The relatively large dimensions of the interposer permit the snaking of thin film conductors along the length of the interposer so as to make complex connections. If necessary, the interposer may carry multiple mutually insulated circuit patterns, in addition to groundplanes. Use of two dimensional arrays of electromechanical contacts permits an increase of circuit density. The ultimate density is determined by the density of the conductors used to make the right angle connection. These dimensions are related to the tolerances of lithographic techniques.

Thus, for a given center-to-center spacing of contacts, increased wiring and input/output density is achieved. The connectors used in making this right angle connection are no longer the ultimate limitation on density.

The silicon interposer rod and silicon substrates may be semiconductor-grade single-crystal silicon formed into rod and chip configurations by wafering and dicing techniques, with polishing by chemical and mechanical techniques which have become relatively standard in the art of integrated circuits. Where interposer rod and substrates are all of the same material, they all have the same coefficient of thermal expansion.

Other substrate and rod materials may be used, so long as they can withstand the temperature cycling without deformations or dislodgment of conductors, so long as they have essentially the same coefficient of thermal expansion, and so long as they are not chemically mismatched to each other or to the conductors, and so long as they are insulators or can be equipped with insulating films to avoid short circuits. Quartz is an example; sapphire is another example. These materials generally are crystalline substrate materials which are insulators and have low coefficients of thermal expansion.

FIG. 3 illustrates a dense three-dimensional package having a multiplicity of vertical substrates and a supporting horizontal substrate. Interposer rods 1 carry conductors 2 which make connection to vertical substrates. Further details will be discussed below, along with discussion of FIGS. 4–6.

FIG. 4 is an end view of the right angle connection mechanism. Interposer rod 1 connects to substrate 3 by microstrip conductor 2 and controlled collapse connector 5. Controlled collapse connector 6 connects microstrip conductor 2 to other conductors (not shown) by a wire or micropin.

FIGS. 5 and 6 illustrate a preferred variation in which the silicon rod interposer is an angle-free square in cross-section, with rounded corners. The silicon interposer rod carries an array of controlled collapse chip connection pads. The flattened sides permit the use of a two-dimensional array of pads to make good contact but still allow the microstrips 2 to be arrayed on lithographic tolerance spacings. Details of ground planes and insulating layers are not shown in these figures, which are illustrative of interposer configuration and multidimensional pad placement. The package makes a variety of configurations of ground plane to ground plane connections and of stripline to stripline connections available to carry out the needs of the circuit designer.

The contact pad array is made up of multiple rows of pads, in echelon, so as to present convenient access to pads 11 by the related conductors. Some pad locations in FIG. 6 have no conductor; some of these pad locations may be used as ground plane connectors. Ground plane connectors connect the ground planes together, also by controlled collapse chip connection techniques.

Dense arrays of logic (see FIG. 3) are assembled with interposer rods 1, providing mechanical and electrical connection, permitting coolant to flow well at low temperatures, and permitting non-destructive temperature cycling. Interposers 1 are connected to conductors 2 by pads 5 and 6, providing electrical connection and mechanical support for Module 1-4 vertical substrates 3, 12, 13 and 14, respectively. All conductors are of very low resistance or superconducting materials, the pattern conductors 2 having relatively high melting points (>500 K.). The connector pads 5 and 6 have relatively low (<400 K.) melting points for easier assembly and disassembly. Pads 6 may have slightly lower melting points than pads 5 to permit selective disassembly.

The modules serve as two-dimensional substrates for circuit chips such as 16, 17 and 18. Two modules (such as Modules 3 and 4) form a field replaceable unit 19—it is only necessary to disconnect pads 6 of the field replaceable unit 19 to permit removal of the unit from horizontal substrate 15.

Conductors 2 may take various paths about their respectively related interposer rods 1, as shown in FIG. 3. For example, electrical connections between Module 3 and Module 4 (FIG. 3) may be made by means of microstrip 2 over the top of interposer rod 1, without using the horizontal substrate at all. Connections from substrate ground planes to interposer ground plane 7 may be made by opening small windows 20-21 (FIG. 2) through insulating film 8 and using controlled collapse connection techniques to connect to ground by connections 22 to other ground planes (shown schematically). FIG. 5 gives a different view of ground plane to ground plane connections. Window openings 23 and 24 in insulating film 8 (analogous to windows 20-21 in FIG. 2) provide access to ground plane conductor 7 on the interposer for controlled collapse chip connectors 11. Connections 25 and 26 provide connections from ground plane to ground plane. The other pads 11 in FIG. 5 are available for circuit connections, such as circuit connection 27 shown in FIG. 5.

The problem is that connection pads are larger in diameter than their respective striplines; since the striplines are already crowded together near their minimum linear spacing within lithographic tolerances, there simply is not enough room for connection pads if placed all in a single row. Since each pad is singularly related to an individually respective stripline, the pads are positioned in echelons in an array pattern, of area greater than a single line of pads. Not all pads are necessarily connected into active circuits; choice of connection is left to the circuit designer. But, once the decision is made to connect a given stripline to its counterpart on a neighboring substrate, there is a respectively related stripline to which it is to be connected. Connection is not direct, however; it is made through the interposer. A selected stripline in the first substrate, terminated in a connection pad in the first array, connects to a connection pad in the third array, on the interposer. A stripline on the interposer connects a respectively related pad in the third array to a respectively related pad in the fourth array. The pad in the fourth array connects to a respectively related pad in the second array, completing the connection. The minimum first substrate to second substrate circuit path is as follows:

first array: stripline on first substrate; connector pad terminating stripline on first substrate; controlled collapse chip connection;

third array: connector pad terminating stripline on interposer; stripline on interposer;

fourth array: connector pad terminating stripline on interposer; controlled collapse chip connection;

second array: connector pad terminating stripline on second substrate; stripline on second substrate. Multilayer connections, made by a variety of known techniques as required by the application, may be used for more complex connections.

Various connection metallizations and solders can be used in well known ways to carry out this packaging technique; for example, certain room temperature liquids such as mercury act like solders, solidifying as the temperature is reduced.

What is claimed is:

1. A multidimensional package for a first circuit-bearing substrate and a second circuit-bearing substrate, each having a conductor pattern providing electrical connection to its circuits, and each having an insulated ground plane characterized by
    (a) an interposer of crystalline substrate material in continuous angle-free cross section bearing an arcuate insulated ground plane and an arcuate pattern of conductors overlying said insulated ground plane;
    (b) first connector means selectively connecting the conductor pattern of the first substrate to the conductor pattern of said interposer; and
    (c) second connector means selectively connecting the arcuate conductor pattern of said interposer to the conductor pattern of said second substrate; and further characterized in that the first substrate, the second substrate and said interposer are all comprised of crystalline substrate materials having essentially the same coefficient of thermal expansion.

2. A circuit package according to claim 1 further characterized in that said crystalline substrate materials having the same characteristic of thermal expansion are of semiconductor grade silicon.

3. A circuit package according to claim 1 further characterized in that the conductor patterns on the first and second substrates, the conductor pattern on said interposer, the ground planes on the first and second substrates, and said insulated ground-plane layer are electrical conductors and said connector means comprise electrically conducting solders having differing melting points to that of the arcuate pattern of conductors and patterns of conductors on the first and second substrate.

4. A circuit package according to claim 3 further characterized in that said first connector means has a melting point differing from the melting point of said second connector means.

5. A circuit package according to claim 4 further characterized in that said electrical conductors are superconductive at cryogenic temperatures.

6. A multidimensional package according to claim 1 further characterized in that
    the first substrate conductor pattern carries a circuit array having conductive striplines spaced, in at least one critical area, near the minimum linear spacing within lithographic tolerances;
    the second substrate conductor pattern carries a circuit array having conductive striplines spaced, in at least one critical area, near the minimum linear spacing within lithographic tolerances;

said interposer arcuate conductor pattern carries a circuit array having conductive striplines spaced, in at least one critical area, near the minimum linear spacing within lithographic tolerances; said first substrate means, said second substrate means and said interposer means all of crystalline substrate material;

said first connector means comprises a first array of connection pads carried by said first substrate and, terminating respective ends of conductive striplines on the first substrate, said pads being spaced apart in echelons at distances significantly greater than the minimum linear spacing within lithographic tolerances;

said second connector means comprises a second array of connection pads carried by said second substrate and terminating respective ends of conductive striplines on the second substrate, said pads being spaced apart in echelons at distances significantly greater than the minimum linear spacing within lithographic tolerances;

said interposer comprises a third array of connection pads terminating first ends of respective conductive striplines on said interposer, said pads being spaced apart in echelons at distances significantly greater than the minimum linear spacing within lithographic tolerances;

said interposer comprises a fourth array of connection pads terminating respective conductive striplines on said interposer at the end opposite said third array of connection pads, said pads being spaced apart in echelons at distances significantly greater than the minimum linear spacing within lithographic tolerances; and further characterized by array connection means for connecting said first array of connection pads to said third array of connection pads, respectively, and for connecting said second array of connection pads to said fourth array of connection pads, respectively.

7. A multidimensional package according to claim 6, further characterized in that the first and second substrate and said interposer each have a ground plane insulated from and underlying the circuit arrays, which with conductive striplines forms transmission lines further characterized by ground plane connection means for providing at a number of points an electrical connection of first substrate ground plane to interposer ground plane to second substrate ground plane whereby the equivalent circuit for a representative circuit connection includes transmission line, small inductance at the discontinuity of the array connection, transmission line, small inductance at the discontinuity of the array connection, transmission line.

8. Circuit connection mechanism according to claim 7 further characterized in that said connection interposer means is a rounded corner flat-sided rod carrying on one flat side said third array of connection pads as a two-dimensional array of connection pads including circuit connection pads and ground plane connection pads, and carrying on another flat side said fourth array of connection pads as a two-dimensional array of connection pads including circuit connection pads and ground plane connection pads.

9. A multidimensional packaging technique for a first circuit-bearing substrate and a second circuit-bearing substrate, each having a conductor pattern providing electrical connection to its circuits, and each having an insulated ground plane characterized by (a) an interposer of crystalline substrate material in continuous angle-free cross section bearing an arcuate insulated ground plane and an arcuate pattern of conductors overlying said insulated ground plane;

(b) first connector means selectively connecting the conductor pattern of the first substrate to the conductor pattern of said interposer; and (c) second connector means selectively connecting the arcuate conductor pattern of said interposer to the conductor pattern of said second substrate, further characterized by (d) third connector means connecting said arcuate insulated ground plane to the insulated ground planes of the first and second circuit-bearing substrates at a number of points dispersed over areas of close approach of substrate ground plane to arcuate ground plane, and further characterized in that said first, second and third connector means are controlled collapse connectors.

* * * * *